United States Patent
Tseng

(10) Patent No.: US 6,432,810 B1
(45) Date of Patent: Aug. 13, 2002

(54) METHOD OF MAKING DUAL DAMASCENE STRUCTURE

(75) Inventor: Horng-Huei Tseng, Hsinchu (TW)

(73) Assignee: Vanguard International Semiconductor Corporation, Hsinchu (TW)

(*) Notice: Subject to any disclaimer, the term of this patent is extended or adjusted under 35 U.S.C. 154(b) by 0 days.

(21) Appl. No.: 09/732,032

(22) Filed: Dec. 6, 2000

(51) Int. Cl.$^7$ .................................... H01L 21/4763
(52) U.S. Cl. .................. 438/618; 438/622; 438/672
(58) Field of Search .................... 438/618–622, 438/729, 672, 675

(56) References Cited

U.S. PATENT DOCUMENTS 6,261,953 B1 * 7/2001 Uozumi .................. 427/419.2

* cited by examiner

Primary Examiner—Jey Tsai
(74) Attorney, Agent, or Firm—Blakely Sokoloff Taylor & Zafman, LLP

(57) ABSTRACT

A method for manufacturing a dual damascene structure comprises forming a first conductive layer over a substrate. An isolation pillar with a second conductive layer is formed on the first conductive layer. A second isolation layer is formed over the second conductive layer. A portion of the second isolation layer is removed, thereby exposing the isolation pillar. A third isolation layer is formed on the first isolation layer. Subsequently, the third isolation layer is patterned to have a trench in the third isolation layer. The isolation pillar is then removed, thereby forming an opening in the first isolation layer. Then, a conductive material is refilled in the trench and the opening, thereby connecting to the first conductive layer.

4 Claims, 2 Drawing Sheets

METHOD OF MAKING DUAL DAMASCENE STRUCTURE

FIELD OF THE INVENTION

The present invention relates to a method of fabricating integrated circuits, and specifically, to a method of making a dual damascene structure.

BACKGROUND OF THE INVENTION

The large integration of semiconductor ICs has been accomplished by a reduction in individual device size. As the integration level of semiconductor devices, increases, each cell generally is reduced in size. To provide for such reduction in cell size, various techniques have been used to improve the performance of the device. For example, DRAM has been increased cell capacitance by increasing the effective area of a cell capacitor. To increase the capacitor's effective area, stacked-capacitor and trench-capacitor structures, as well as combinations thereof, have been developed. With this reduction of device size, many challenges arise in the manufacture of the ICs. Each device requires interconnections for exchanging electrical signals from one device to another device. Specially, the high performance integrated circuits have multi-level connections. Additional miniaturization is highly desirable for improved IC performance and cost reduction. Interconnects provide the electrical connections between the various electronic elements of an IC and they form the connections between these elements.

Many devices includes conductive lines for performing certain function, such as a bit line contact and a storage node contact must all be formed in a DRAM unit cell. Thus, design rules for minimizing area and ensuring adequate process margin are required. A variety of techniques are employed to create interconnect lines and vias. One such technique involves a process generally referred to as dual damascene, which includes forming a trench and an underlying via hole. The trench and the via hole are simultaneous filled with a conductor material, thereby simultaneously forming an interconnect and an underlying plug. This is a preferred structure for low RC interconnect structures. Interconnect structures containing copper are typically fabricated by a Damascene process.

U.S. Pat. No. 6,140,226 to Grill, et al., entitled "Dual damascene processing for semiconductor chip interconnects". The prior art involves the Dual Damascene process. A further prior art may refer to U.S. Pat. No. 6,133,140 to Yu, et al., entitled "Method of manufacturing dual damascene utilizing anisotropic and isotropic properties". Another one of the arts related to the dual damascene is disclosed in U.S. Pat. No. 6,077,770. However, none of the prior art with the capability to control the width of the conductive line.

What is needed is a method of controlling the wide of the upper conductive line for dual damascene.

SUMMARY OF THE INVENTION

The object of the present invention is to form a conductive plug with the capability to control the width of the conductive line for dual damascene.

A method for manufacturing a dual damascene structure comprises forming a first conductive layer over a substrate. An isolation pillar is formed on the first conductive layer. A second conductive layer is next formed along a surface of the isolation pillar and the first conductive layer. A second isolation layer is formed over the second conductive layer. A portion of the second isolation layer is removed, thereby exposing the isolation pillar. A third isolation layer is formed on the first isolation layer. Subsequently, the third isolation layer is to etched to form a trench in the third isolation layer. The isolation pillar is then removed, thereby forming an opening in the first isolation layer. Then, a conductive material is refilled in the trench and the opening, thereby connecting to the first conductive layer.

The dual damascene structure comprises a first conductive layer 6 over a substrate. A conductive plug 20 is formed on the first conductive layer 6. A second conductive layer 10 is formed on the surface of the first conductive layer and on the side wall of the conductive plug 20. A further isolation layer 12 is formed on the second conductive layer 6 and another isolation layer 14 is formed on the isolation layer 12 to have a trench exposing a portion of the isolation layer 12 and the plug 20. A further conductive material 20 is filled into the trench and connect to the conductive plug.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
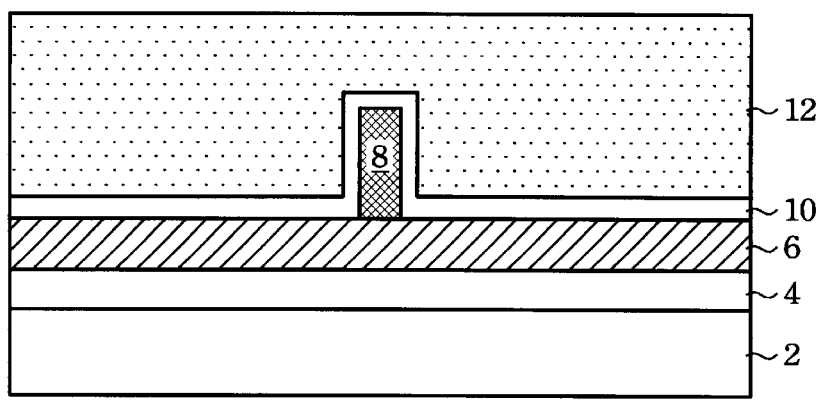
FIG. 1 is a cross sectional view of a semiconductor wafer illustrating the step of forming pillar and thin conductive layer in accordance with the present invention.

The present invention relates to a method of making a conductive line for interconnections by using dual damascene technique. It is appreciated that the present invention may be applied to any device. A method for manufacturing a conductive plug in a trench with the capability of controlling the width of the conductive line.

As will be seen below, turning now to FIG. 1, a substrate 2 is provided, the substrate can be formed of silicon, GaAs, Ge and so on. For example, a single crystal silicon substrate 2 with a <100> crystallographic orientation is shown. Within the substrate 2 may be formed one or more semiconductor devices. The particular devices or their functions are not particularly germane to the present invention. However, the conductive structure for the devices are the subjects of the present invention.

An isolation layer 4 such as silicon oxide layer or silicon nitride layer is then formed on the surface of the substrate 2. The silicon oxide is typically formed by using any suitable oxide chemical compositions and procedures. The silicon nitride layer is deposited by any suitable process. For example, Low Pressure Chemical Vapor Deposition (LPCVD), Plasma Enhance Chemical Vapor Deposition (PECVD), High Density Plasma Chemical Vapor Deposition (HDPCVD). The thickness of the silicon nitride layer is about 1000 to 2000 angstroms. In the preferred embodiment, the reaction gases of the step to form silicon nitride layer include $SiH_4$, $NH_3$, $N_2$, $N_2O$ or $SiH_2Cl_2$, $NH_3$, $N_2$, $N_2O$.

A conductive layer 6 is formed over the first isolation layer 4. As known in the art, the conductive layer 6 includes any suitable conductive material such as copper, aluminum, titanium, tungsten, gold and the combination thereof. Subsequently, an isolation pillar 8 is formed by patterning a second isolation layer. In a preferred embodiment, the width of the pillar may range from 0.1–0.3 micron meter depending on the requirement. Thereafter, a second conductive layer 10 is formed over the first conductive layer 6 and along the surface of the isolation pillar 8, thereby forming conductive material on the side wall of the pillar 8. It is appreciated that controlling the thickness of the layer 10 may control the width of the conductive layer attached on the side wall. The second conductive layer 10 can be a metallic layer formed by a sputtering method.

Figure 2:
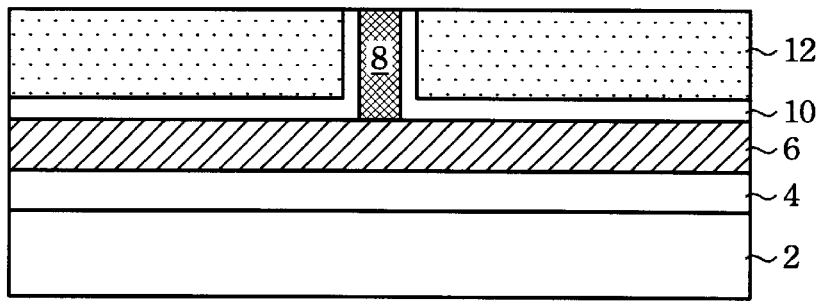
FIG. 2 is a cross sectional view of a semiconductor wafer illustrating the steps of performing a chemical mechanical polishing in accordance with the present invention.

Next, as shown in FIG. 1, a third isolation layer 12 is formed over the second conductive layer 10. Thereafter, a portion of the third isolation layer 12 and a portion of the second conductive layer 10 are removed using a chemical-mechanical polishing method to the surface of the isolation pillar 8, as shown in FIG. 2.

Figure 3:
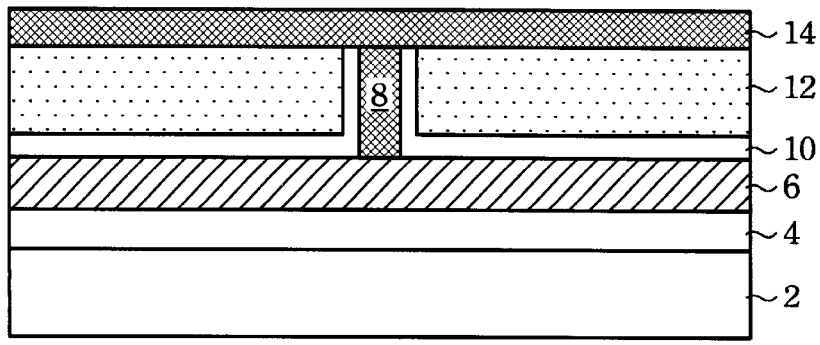
FIG. 3 is a cross sectional view of a semiconductor wafer illustrating the step of forming an isolation layer in accordance with the present invention.
Figure 4:
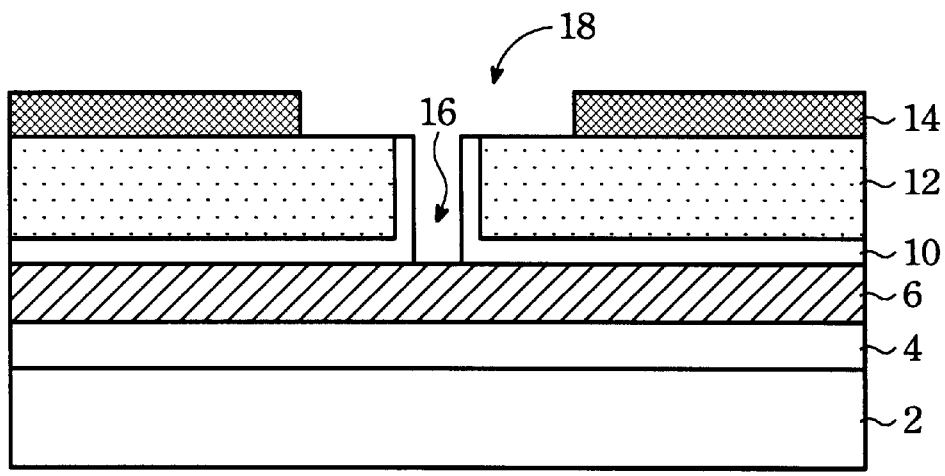
FIG. 4 is a cross sectional view of a semiconductor wafer illustrating the step of forming a trench in accordance with the present invention.

Please refer to FIG. 3, a further isolation layer 14 is formed over the polished surface. Preferably, the material of the fourth isolation layer 14 is the same with the one of the isolation pillar 8. Next, lithography technique is used to form a trench 18 in the fourth isolation layer 14. The patterned structure is successively used to act as etching mask for removing the pillar 8, thereby forming an opening 16 in the third isolation layer 12 with conductive material attached on the side wall as shown in FIG. 4. The method may expand the width of the plug for interconnection. For example, if the initial opening width is approximately the width of pillar 8. The width may be expanded by adding the second conductive layer to save the cost to modify the photo mask. It has to be noted that the isolation layer 14 and the isolation pillar are made with the same material. The isolation layer 14 or the isolation pillar is different from the isolation layer 12.

Figure 5:
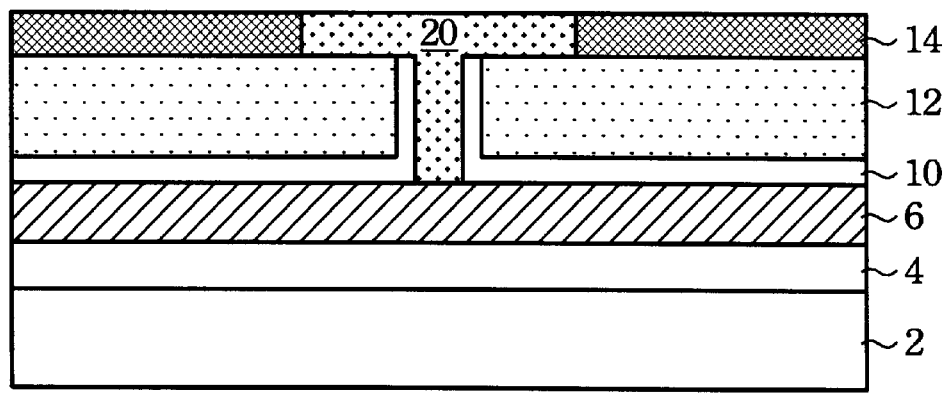
FIG. 5 is a cross sectional view of a semiconductor wafer illustrating the step of forming a conductive plug in accordance with the present invention.

Referring to FIG. 5, a conductive material 20 is then formed over the isolation layer 14 and refilled into the opening 16 and the trench 14. Similarly, a portion of the conductive layer 20 is removed by chemical mechanical polishing for plararization. It can be understand from the illustration, the plug consisting of the conductive material 10, 20 filled in the opening 16 has a wider width. The feature of the present invention is to form an underlying conductive layer prior to form the isolation pillar 8. Thus, the second conductive layer 12 is thinner compared to the first conductive layer 6. The advantage of using the present invention includes control the size of the plug by controlling the thickness of the thin conductive layer 10. A self-alignment dual damascene may be achieved.

The dual damascene structure comprises a first conductive layer 6 over a substrate. A conductive plug 20 is formed on the first conductive layer 6. A second conductive layer 10 is formed on the surface of the first conductive layer and on the side wall of the conductive plug 20. A further isolation layer 12 is formed on the second conductive layer 6 and another isolation layer 14 is formed on the isolation layer 12 to have a trench exposing a portion of the isolation layer 12 and the plug 20. A further conductive material 20 is filled into the trench and connect to the conductive plug.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for manufacturing a dual damascene structure, said method comprising the steps of:

forming a first conductive layer over a substrate;

forming an isolation pillar on said first conductive layer;

forming a second conductive layer along a surface of said isolation pillar and said first conductive layer;

forming a second isolation layer over said second conductive layer;

removing a portion of said second isolation layer, thereby exposing said isolation pillar;

forming a third isolation layer on said second isolation layer;

patterning said third isolation layer to form a trench in said third isolation layer;

removing said isolation pillar, thereby forming an opening in said second isolation layer;

refilling a conductive material in said trench and said opening, thereby connecting to said first conductive layer;

wherein said second conductive layer is thinner compared to said first conductive layer, the re by controlling a size of said conductive plug by controlling the thickness of said second conductive layer.

2. The method of claim 1, wherein said second isolation layer is different from said isolation pillar.

3. The method of claim 1, wherein said second isolation layer is different from said third isolation.

4. The method of claim 1, wherein said second isolation and said isolation pillar are made with the same material.

\* \* \* \* \*